(12) United States Patent
Ting et al.

(10) Patent No.: US 11,538,979 B2
(45) Date of Patent: Dec. 27, 2022

(54) PIEZOELECTRIC ENERGY HUNTING DEVICE WITH LIGHTWEIGHT DESIGN AND VOLTAGE SIGNAL APPLICATION SYSTEM THEREOF

(71) Applicant: CHUNG-YUAN CHRISTIAN UNIVERSITY, Chung Li (TW)

(72) Inventors: Yung Ting, Chung Li (TW);
Sheuan-Perng Lin, Chung Li (TW);
Chih-Hsuan Yu, Chung Li (TW);
Yu-Chun Hung, Chung Li (TW)

(73) Assignee: CHUNG-YUAN CHRISTIAN UNIVERSITY, Chung Li (TW)

( * ) Notice: Subject to any disclaimer, the term of this patent is extended or adjusted under 35 U.S.C. 154(b) by 343 days.

(21) Appl. No.: 17/024,559

(22) Filed: Sep. 17, 2020

(65) Prior Publication Data
US 2021/0151662 A1 May 20, 2021

(30) Foreign Application Priority Data
Nov. 20, 2019 (TW) .................. 108142209

(51) Int. Cl.
*H01L 41/113* (2006.01)
*H01L 41/083* (2006.01)
(Continued)

(52) U.S. Cl.
CPC ........... *H01L 41/0833* (2013.01); *A43B 3/38* (2022.01); *B62M 3/16* (2013.01); *G06K 19/0711* (2013.01);
(Continued)

(58) Field of Classification Search
CPC ............... H01L 41/113; H01L 41/1132; H01L 41/1134; H01L 41/1136; H01L 41/1138;
(Continued)

(56) References Cited

U.S. PATENT DOCUMENTS

2006/0021261 A1* 2/2006 Face .................... A43B 13/00
36/132
2008/0083139 A1* 4/2008 Mullen .................... H02N 2/18
36/25 R
(Continued)

FOREIGN PATENT DOCUMENTS

| CN | 103580535 A | 2/2014 |
| CN | 105476158 A | 4/2016 |
| CN | 207784456 U | 8/2018 |

*Primary Examiner* — Derek J Rosenau
(74) *Attorney, Agent, or Firm* — Muncy, Geissler, Olds & Lowe, P.C.

(57) ABSTRACT

A piezoelectric energy hunting device and a voltage signal application system thereof are disclosed. The piezoelectric energy hunting device includes a plurality of curved piezoelectric elements, a plurality of rigid foams, and a flexible foam structure. The plurality of curved piezoelectric elements are arranged side by side with one another, wherein each curved piezoelectric element is attached to one of the rigid foams. The flexible foam structure includes a top foam and a bottom foam covering the outer surface of the plurality of curved piezoelectric elements and the plurality of rigid foams; when the flexible foam structure is compressed, the plurality of curved piezoelectric elements are simultaneously deformed, thereby generating a voltage signal. When the flexible foam structure is not compressed, the flexible foam structure and the plurality of rigid foams provide an elastic force to restore the plurality of curved piezoelectric elements.

16 Claims, 7 Drawing Sheets

(51) Int. Cl.
*H01L 41/053* (2006.01)
*G06K 19/07* (2006.01)
*H02J 50/00* (2016.01)
*B62M 3/16* (2006.01)
*A43B 3/38* (2022.01)
*B62M 3/08* (2006.01)

(52) U.S. Cl.
CPC ........ *G06K 19/0724* (2013.01); *H01L 41/053* (2013.01); *H01L 41/113* (2013.01); *H02J 50/001* (2020.01); *B62M 3/08* (2013.01)

(58) Field of Classification Search
CPC .......... H02N 2/18; H02N 2/181; H02N 2/183; H02N 2/185; H02N 2/186; H02N 2/188
USPC ........................................................ 310/339
See application file for complete search history.

(56) References Cited

U.S. PATENT DOCUMENTS

2008/0084138 A1* 4/2008 Micallef .................. H02N 2/18
                                                                  310/339
2017/0324022 A1* 11/2017 Ting ...................... H01L 41/053
2020/0091759 A1 3/2020 Ting et al.

* cited by examiner

PIEZOELECTRIC ENERGY HUNTING DEVICE WITH LIGHTWEIGHT DESIGN AND VOLTAGE SIGNAL APPLICATION SYSTEM THEREOF

BACKGROUND OF THE INVENTION

1. Field of the Invention

The present invention relates to a piezoelectric energy hunting device with a lightweight design and a voltage signal application system thereof, and more particularly, to a piezoelectric energy hunting device with a lightweight design having a protective structure and a voltage signal application system thereof.

2. Description of the Related Art

With the progress of the times, batteries have become indispensable components, and battery life has become an important consideration for users. To increase the usage time of electronic devices, a variety of energy hunting devices that use the environment to generate electricity independently have been developed. Briefly, an energy hunting device collects and stores energy from the surrounding environment and transforms it into electrical energy for use by the connected equipment. The energy hunting device can collect energy from environmental energy sources, which mainly provide light energy, vibration energy, heat energy, radio wave, and inductive energy.

An energy hunting device with piezoelectric elements has been proposed in the prior art. When the piezoelectric element is compressed by an external force, the piezoelectric element can generate electricity. For example, US Publication No. 2020/0091759 A1 discloses an intelligent energy hunting device. In the prior art, the structure of the energy hunting device is protected by a metal shell, and the piezoelectric element needs to be attached to the curved elastic metal shell so that the curved elastic metal shell can provide an elastic force to the piezoelectric element. As a result, the weight of the energy hunting device will increase, making it less suitable for use on clothes, shoes or other personal belongings. Furthermore, the piezoelectric element itself is not protected properly, and it is easily damaged when repeatedly compressed over a long period of use.

Therefore, it is necessary to propose a new piezoelectric energy hunting device with a lightweight design and a voltage signal application system thereof to solve the problems encountered in the prior art.

SUMMARY OF THE INVENTION

It is an object of the present invention to provide a piezoelectric energy hunting device with a lightweight design and a protective structure.

It is another object of the present invention to provide a voltage signal application system comprising the piezoelectric energy hunting device.

In order to achieve the above objects, the present invention provides a piezoelectric energy hunting device with a lightweight design for generating a voltage signal. The piezoelectric energy hunting device comprises a plurality of curved piezoelectric elements, a plurality of rigid foams, and a flexible foam structure. The plurality of curved piezoelectric elements are arranged side by side with one another, wherein each curved piezoelectric element is attached to one of the rigid foams. The flexible foam structure comprises atop foam and a bottom foam and covers the outer surface of the plurality of curved piezoelectric elements and the plurality of rigid foams; when the flexible foam structure is compressed, the plurality of curved piezoelectric elements are simultaneously deformed, thereby generating the voltage signal; when the flexible foam structure is not compressed, the flexible foam structure and the plurality of rigid foams jointly provide an elastic force to restore the plurality of curved piezoelectric elements.

The present invention also provides a voltage signal application system comprising an application device and a piezoelectric energy hunting device. The piezoelectric energy hunting device is used for providing a voltage signal to the application device. The piezoelectric energy hunting device comprises a plurality of curved piezoelectric elements, a plurality of rigid foams, and a flexible foam structure. The plurality of curved piezoelectric elements are arranged side by side with one another, wherein each curved piezoelectric element is attached to one of the rigid foams. The flexible foam structure comprises a top foam and a bottom foam and covers the outer surface of the plurality of curved piezoelectric elements and the plurality of rigid foams; when the flexible foam structure is compressed, the plurality of curved piezoelectric elements are simultaneously deformed, thereby generating the voltage signal; when the flexible foam structure is not compressed, the flexible foam structure and the plurality of rigid foams jointly provide an elastic force to restore the plurality of curved piezoelectric elements.

DETAILED DESCRIPTION OF THE PREFERRED EMBODIMENTS

In order to make the structure and characteristics as well as the effectiveness of the present invention further understood and recognized, the detailed description of the present invention is provided as follows along with embodiments and accompanying figures.

Figure 1:
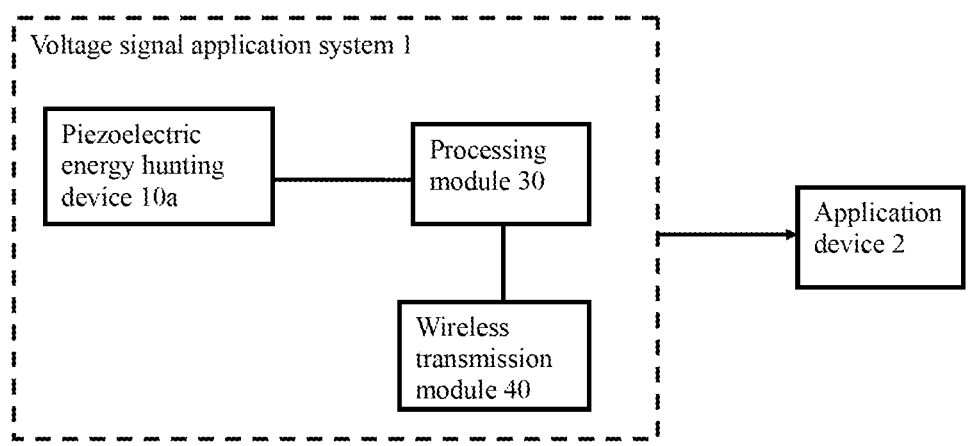
FIG. 1 illustrates a schematic diagram of the structure of a voltage signal application system of the present invention.

Please refer to FIG. 1 for a schematic diagram of the structure of a voltage signal application system of the present invention.

The voltage signal application system 1 of the present invention is used for generating and transmitting a signal to the application device 2 and can also generate a power signal provided to the application device 2. The voltage signal application system 1 includes a piezoelectric energy hunting device with a lightweight design 10a, a processing module 30, and a wireless transmission module 40. The piezoelectric energy hunting device 10a generates a voltage signal by piezoelectric induction.

Figure 2A:
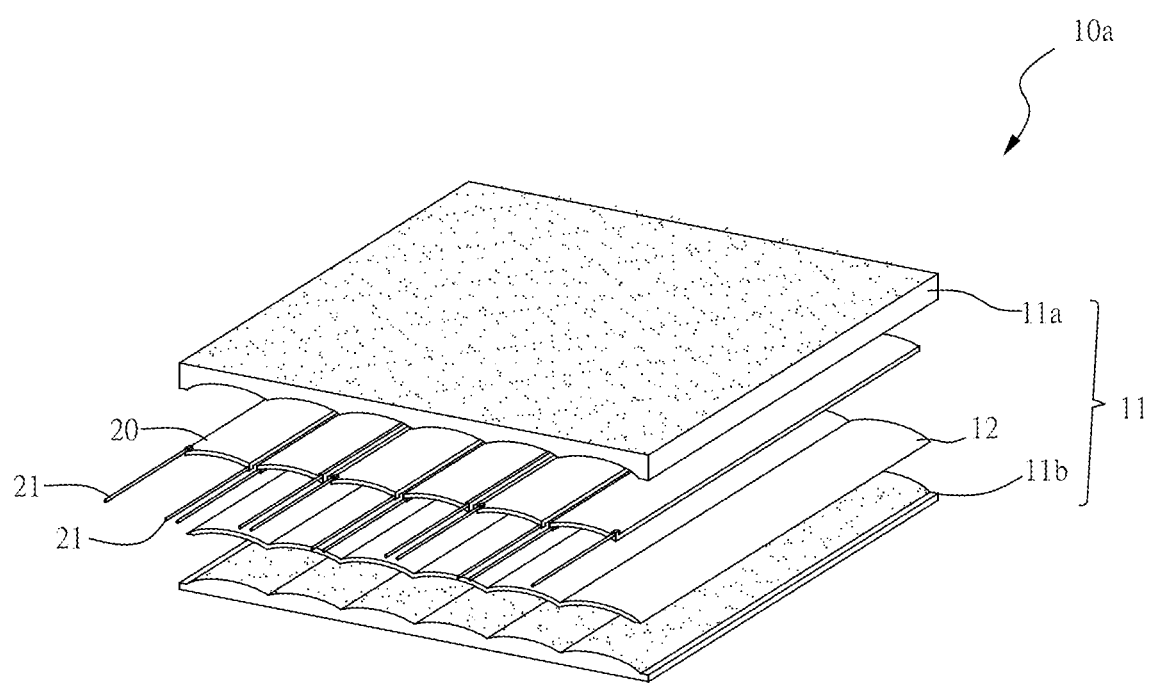
FIG. 2A illustrates an explosive schematic diagram of a first embodiment of a piezoelectric energy hunting device of the present invention.
Figure 2B:
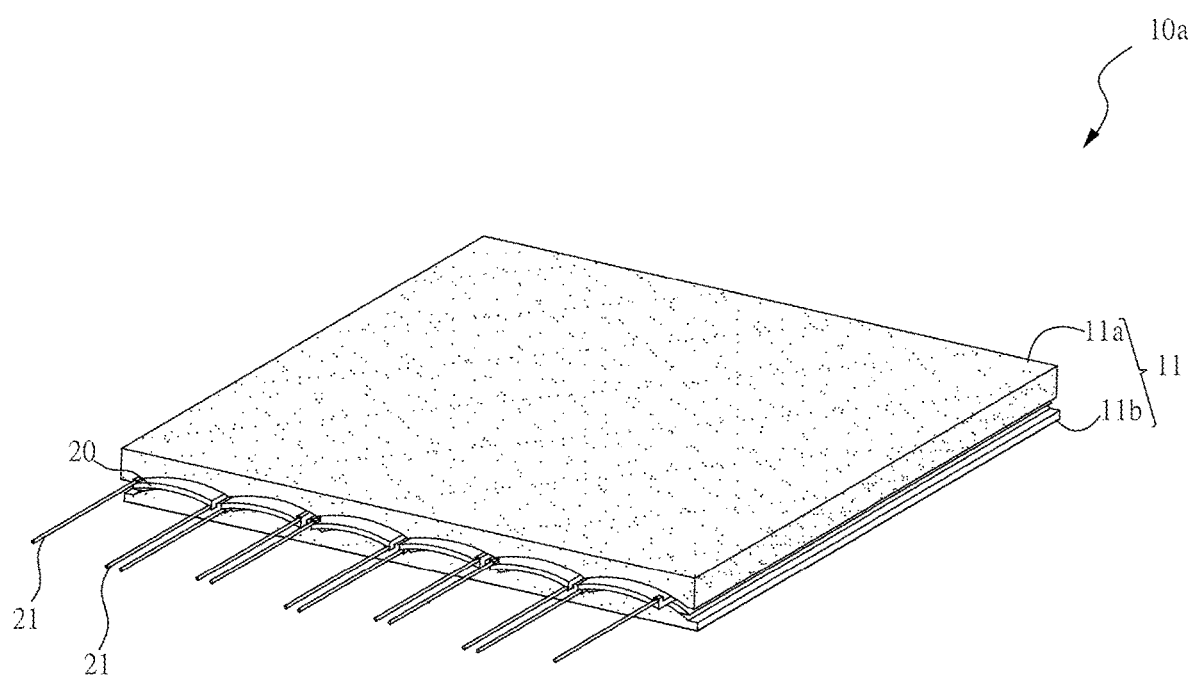
FIG. 2B illustrates a schematic diagram of the appearance of the first embodiment of the piezoelectric energy hunting device of the present invention.

Please also refer to FIG. 2A for the explosive schematic diagram of the first embodiment of the piezoelectric energy hunting device of the present invention and FIG. 2B for the schematic diagram of the appearance of the first embodiment of the piezoelectric energy hunting device of the present invention.

Figure 4A:
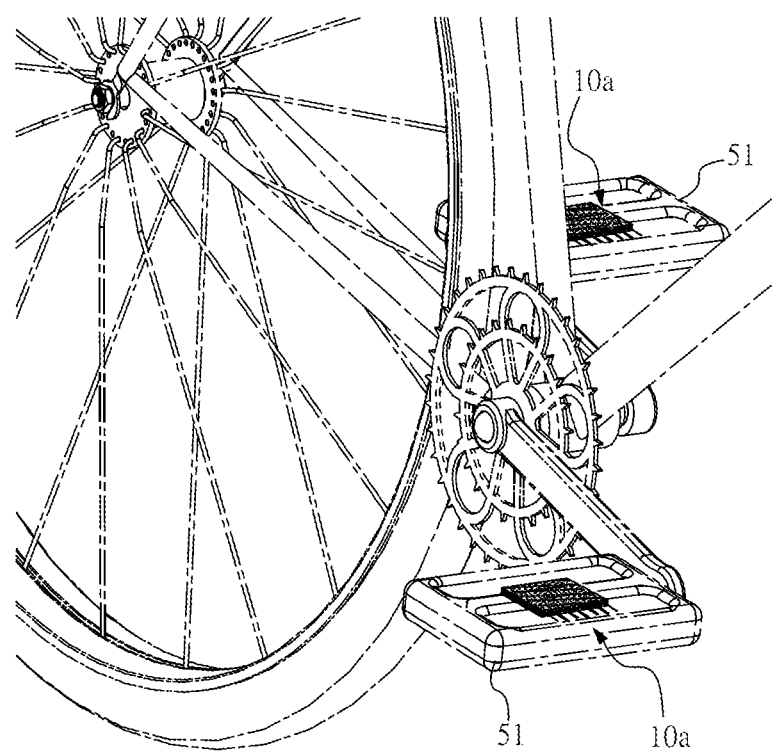
FIG. 4A illustrates a schematic diagram of a first application device of the voltage signal application system of the present invention.
Figure 4B:
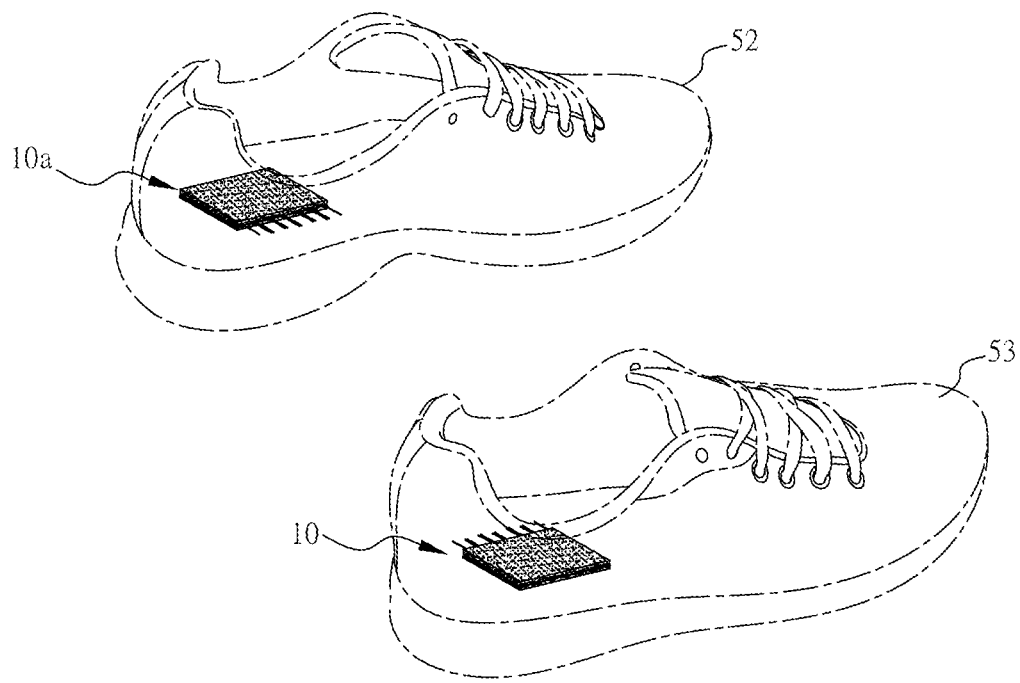
FIG. 4B illustrates a schematic diagram of a second application device of the voltage signal application system of the present invention.

In the first embodiment of the present invention, the piezoelectric energy hunting device 10a includes a flexible foam structure 11, a plurality of rigid foams 12, and a plurality of curved piezoelectric elements 20. The plurality of curved piezoelectric elements 20 and the plurality of rigid foams 12 are all disposed in the flexible foam structure 11. The plurality of curved piezoelectric elements 20 of the piezoelectric energy hunting device 10a are arranged side by side with one another. Each curved piezoelectric element 20 is connected to the positive and negative terminals by the wire 21, and then the wire 21 is electrically connected to the processing module 30. The curved piezoelectric element 20 can be a curved piezoelectric ceramic element or a flexible piezoelectric element. The material of the flexible piezoelectric element can be polyvinylidene difluoride (PVDF) or a composite material of PVDF and lead zirconate titanate (Piezoelectric Ceramic Transducer, PZT), but the present invention is not limited thereto. Each curved piezoelectric element 20 is attached to one single rigid foam 12 so that the plurality of rigid foams 12 can provide additional elastic force for recovery. The rigid foam 12 has a sheet-like arc shape, which can correspond to the curvature of the curved piezoelectric element 20. The material coefficient of the rigid foam 12 is close to the material coefficient of elastic metal in the prior art. The Young's modulus of the prior art elastic metal is 195 GPa, the Poisson's ratio is 0.27, and the density is 8000 KG/m^3. The material coefficient of the rigid foam 12 is within one percent of these values, but the present invention is not limited thereto. Therefore, the rigid foam 12 can replace the arc-shaped metal structure attached to the curved piezoelectric element 20 in the prior art, and the weight of the modularized piezoelectric energy hunting device 10a can thereby be greatly reduced. As the piezoelectric energy hunting device 10a is placed in the shoe (as shown in FIG. 4B) in the application device, the weight will be a significant consideration.

The flexible foam structure 11 includes a top foam 11a and a bottom foam 11b. The upper portion of the top foam 11a is a single plane or an arc, and the lower portion comprises a plurality of arcs. The upper portion of the bottom foam 11b comprises a plurality of hills, and the lower portion is a single plane or an arc. The shapes of the top foam Sla and the bottom foam 11b all correspond to the curvature of the curved piezoelectric element 20. Therefore, the curved piezoelectric element 20 and the plurality of rigid foams 12 are sandwiched between the top foam 11a and the bottom foam 11b. In summary, the structure of the piezoelectric energy hunting device 10a from top to bottom comprises the top foam 11a, the plurality of curved piezoelectric elements 20, the plurality of rigid foams 12, and the bottom foam 11b, forming a rectangular body shape.

In this way, when the flexible foam structure 11 is compressed by an external force, the plurality of curved piezoelectric elements 20 and the plurality of rigid foams 12 are deformed simultaneously to generate the voltage signal due to the Direct Piezoelectric Effect. It should be noted that the rigidity of the plurality of the rigid foams 12 will be greater than the rigidity of the top foam 11a and the rigidity of the bottom foam 11b so that the plurality of rigid foams 12 can be deformed smoothly. When the external force is stopped, the flexible foam structure 11 and the plurality of rigid foams 12 can provide elastic force in addition to the elastic force of the curved piezoelectric element 20 to restore the curved piezoelectric element 20 to its original shape.

Figure 3A:
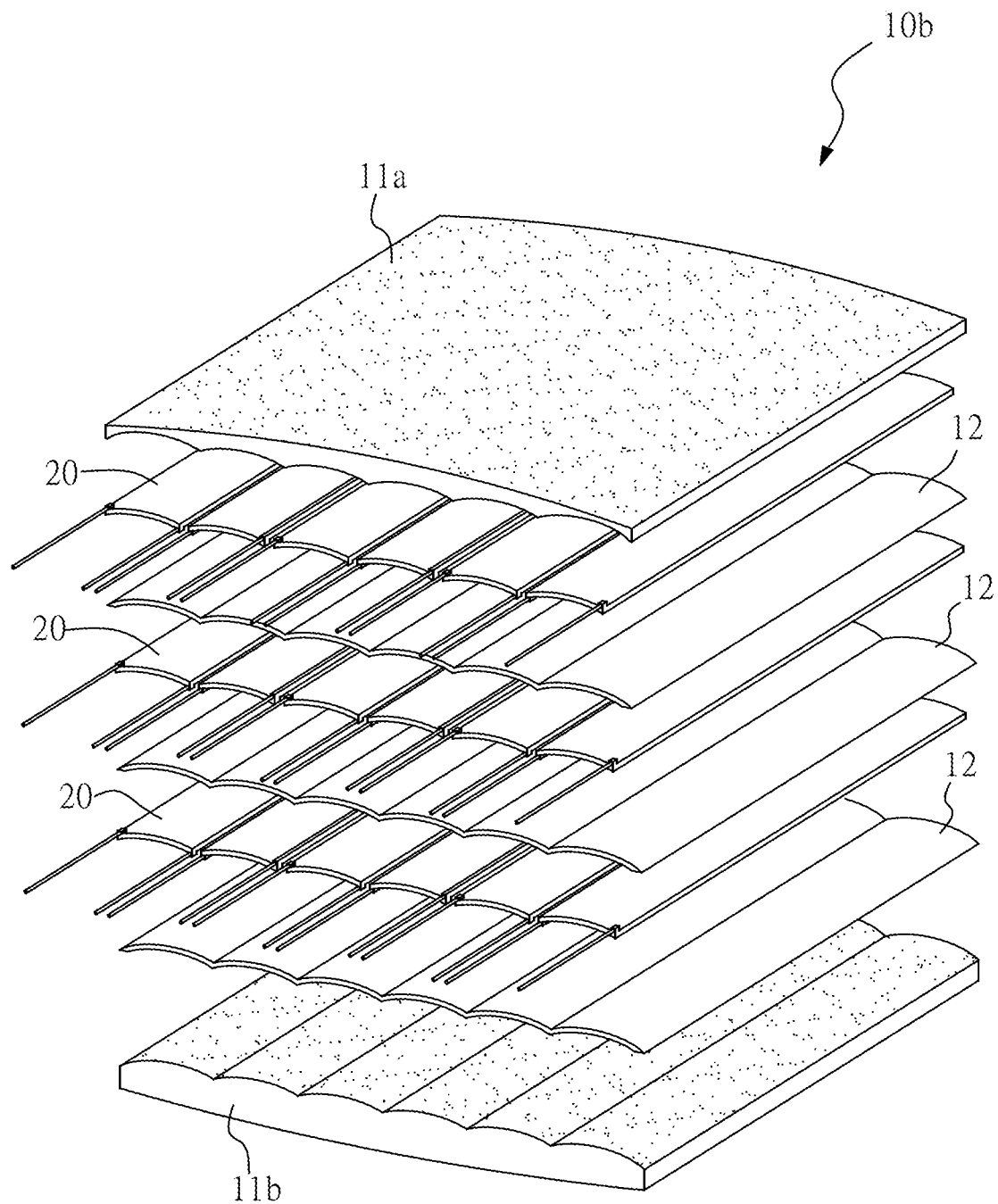
FIG. 3A illustrates an explosive schematic view of a second embodiment of the piezoelectric energy hunting device of the present invention.
Figure 3B:
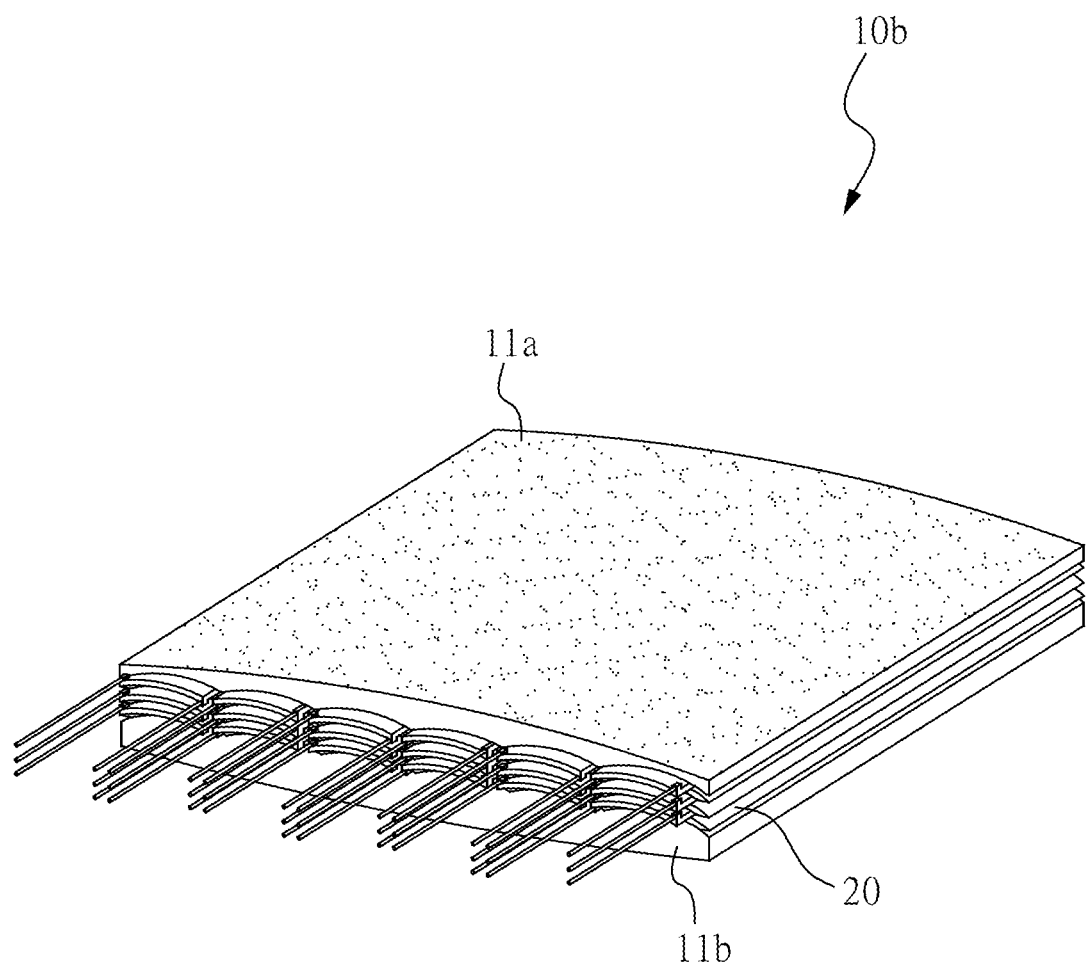
FIG. 3B illustrates a schematic diagram of the appearance of the second embodiment of the piezoelectric energy hunting device of the present invention.

Please also refer to FIG. 3A for an explosive schematic view of a second embodiment of the piezoelectric energy hunting device of the present invention, and FIG. 3B for a schematic diagram of the appearance of the second embodiment of the piezoelectric energy hunting device of the present invention.

In the second embodiment of the present invention, the top foam 11a and the bottom foam 11b of the piezoelectric energy hunting device 10b may comprise a plurality of layers of curved piezoelectric elements 20 and rigid foams 12 staggered therebetween. That is, there are many layers of curved piezoelectric elements 20 and rigid foams 12 disposed between the top foam 11a and the bottom foam 11b. When the top foamed 11a and the bottom foam 11b are compressed by an external force, the plurality of layers of curved piezoelectric elements 20 and the plurality of rigid foams 12 are deformed simultaneously to generate the voltage signal due to the Direct Piezoelectric Effect. The piezoelectric energy hunting device in the prior art is equipped with curved elastic metal elements. Therefore, when multiple layers of piezoelectric elements are provided, the curved elastic metal elements of the different layers are prone to contacting the other layers accidentally. In the present invention, because the curved piezoelectric elements 20 of the different layers are separated by the rigid foams 12, the curved piezoelectric elements 20 of the different layers are separated by the rigid foams 12 and thus will not contact the other layers. Furthermore, compared with the prior art, the piezoelectric energy hunting device 10b of the second embodiment of the present invention can accommodate more layers of curved piezoelectric elements 20 within the same spatial volume and thus can generate more power.

Thus, the flexible foam structure 11 and the rigid foams 12 can effectively support and protect the curved piezoelectric elements 20 and can also help restore the curved piezoelectric elements 20 to the original shape. Compared with the metal shell, curved elastic metal elements or other filling materials of the prior art, the flexible foam structure 11 and the rigid foams 12 are lighter in weight. Therefore, the present invention is different from the prior art, in which the piezoelectric element is attached to a metal sheet. The present invention uses the rigid foams 12, which are strong enough to replace the metal sheet as the filling material to isolate and support the piezoelectric element 20. Not only can the weight be greatly reduced, but in the same limited space, the prior art can attach only one piezoelectric element to the metal sheet bracket, and the space under the bracket is unused space. The rigid foams 12 of the present invention can fill the entire area, and the plurality of curved piezoelectric elements 20 can be installed in the plurality of layers of rigid foams 12. Thus, by connecting the electrical output of the curved piezoelectric elements 20 in parallel, the power generation can be increased proportionally.

In this way, the voltage signal application system 1 of the present invention can be applied in various application devices 2. Please refer to FIGS. 4A and 4B. FIG. 4A illustrates a schematic diagram of a first application device of the voltage signal application system of the present invention, and FIG. 4B is a second application device of the voltage signal application system of the present invention.

In an embodiment of the present invention, the piezoelectric energy hunting device 10a or 10b can be designed to fit in casual sports shoes or bicycle pedals. If the piezoelectric energy hunting device 10a or 10b is operated at about 2 Hz, then about 10 mW of energy can be generated in a period of time, but the present invention is not limited to this case. Thus, the piezoelectric energy hunting device 10a or 10b can be used in wireless Bluetooth communication, identity authentication, pedometers, LED light displays, emergency support signals, etc., and it can also cooperate with regional signal receivers set up by users to realize the application of location tracking, but the present invention is not limited thereto. For example, in the first application device or in the second application device of the present invention, the piezoelectric energy hunting device 10a or 10b is disposed in a bicycle pedal 51 or in shoes 52, 53, and the piezoelectric energy hunting device 10a or 10b is compressed to generate electricity for providing power to the application devices 1 or 2. For example, the generated power signal can be used for wireless communication to transmit control command signals or data to mobile phones, pedometers, etc. It can also be used to light up LED lights and display different modes for entertainment or special purposes.

Furthermore, the processing module 30 of the voltage signal application system 1 is used for calculating the frequency generated by a voltage signal. The wireless transmission module 40 is used for connecting to the application device 2 via a wireless transmission path, such as a Bluetooth transmission path, but the invention is not limited thereto. When the frequency generated by the voltage signal exceeds a threshold, the processing module generates and transmits a notification signal to the application device 2 via the wireless transmission path. Therefore, when the application device 2 is an alarm, the corresponding voltage signal can be generated according to the specific pressure mode set by the piezoelectric energy hunting device 10a or 10b to determine whether there is an emergency. For example, when the processing module 30 calculates the frequency of the voltage signal, if the processing module 30 determines that the frequency of the voltage signal exceeds the threshold within the set time, then the processing module 30 can determine the number of voltage signal peaks; if the set time and set number are 5 peaks in one second, that is, if the user uses one foot to step 5 times on the piezoelectric energy hunting device 10a or 10b of the bicycle pedal 51 or the shoes 52, 53 in one second, then the processing module 30 generates a notification signal. Then the wireless transmission module 40 is used for transmitting the notification signal to the application device 2 so as to cause the application device 2 to send an emergency signal. However, the voltage signal application system 1 of the present invention is not limited to the above-mentioned application.

Moreover, the application device 2 can also comprise a radio frequency identification system signal receiver or an access control management module. The voltage signal application system 1 can work with the processing module 30 and the wireless transmission module 40 to generate a radio frequency identification system (RFID) signal to be received by a radio frequency identification system signal receiver of the application device 2. Taking the shoes 52, 53 as an example, the shoes 52, 53 worn by the user can be regarded as having different IDs to create different combinations. The IDs of shoes 52, 53 can send different radio frequency identification system signals to the RFID system signal receiver of the application device 2 for authentication. For example, unlike traditional movement- or pressure-sensitive lamps, which detect and illuminate when anyone is passing by, the application device 2 can work in conjunction with a security sensor light to provide security lighting only when specific identification signal packets are received by the voltage signal application system 1 of the present invention and a radio frequency identification system, and the application device 2 can thus perform a security lighting function.

In addition, the radio frequency identification system signal can further enable the application device 2 to perform access control management. For example, the shoes 52 and 53 can generate signals of specific frequencies within a specified time range, such as if the user does not move the shoe 52 but steps on the shoe 53 twice within one second. Because different signal combinations of the different radio frequency identification system signals independently emitted by the shoes 52 and 53 can be identified, actively sending a signal to the application device 2 can achieve the effect of turning on a security sensor light or opening/closing a door. In addition, regional signal receivers can be deployed locally. When the shoes 52, 53 are stepped on, they can send radio frequency identification system signals to the regional signal receivers for identity recognition and to the receiver of the application device 2 for location tracking. Thus, the piezoelectric energy hunting device 10a or 10b of the present invention can cooperate with the designed energy management module 30 so that the voltage signal application system 1 does not require an additional power supply and can realize autonomous energy management. Furthermore, the piezoelectric energy hunting device 10a or 10b can actively transmit and receive signals, and it can also cooperate with the application device 2 to perform a wider range of applications.

It is noted that the described embodiments are only for illustrative and exemplary purposes, and that various changes and modifications may be made to the described embodiments without departing from the scope of the invention as disposed by the appended claims.

What is claimed is:

1. A piezoelectric energy hunting device with a lightweight design for generating a voltage signal, the piezoelectric energy hunting device comprising:
   a plurality of curved piezoelectric elements arranged side by side with one another;
   a plurality of rigid foams, wherein each curved piezoelectric element is attached to one of the rigid foams; and
   a flexible foam structure covering the outer surface of the plurality of curved piezoelectric elements and the plurality of rigid foams; when the flexible foam structure is compressed, the plurality of curved piezoelectric elements are simultaneously deformed, thereby generating the voltage signal; when the flexible foam structure is not compressed, the flexible foam structure and the plurality of rigid foams provide an elastic force to restore the plurality of curved piezoelectric elements.

2. The piezoelectric energy hunting device with the lightweight design as claimed in claim 1, wherein the flexible foam structure comprises a top foam and a bottom foam, and the inner shapes of the top foam and the bottom foam correspond to the curvature of the curved piezoelectric element, thereby sandwiching the plurality of curved piezoelectric elements and the plurality of rigid foams between the top foam and the bottom foam.

3. The piezoelectric energy hunting device with the lightweight design as claimed in claim 2, wherein the top foam and the bottom foam comprise a plurality of layers of the plurality of curved piezoelectric elements and the plurality of rigid foams disposed therebetween.

4. The piezoelectric energy hunting device with the lightweight design as claimed in claim 1, wherein each curved piezoelectric elements is a curved piezoelectric ceramic element.

5. The piezoelectric energy hunting device with the lightweight design as claimed in claim 1, wherein each curved piezoelectric element is a flexible piezoelectric element.

6. The piezoelectric energy hunting device with the lightweight design as claimed in claim 1, wherein the piezoelectric energy hunting device is disposed in a shoe or in a bicycle pedal.

7. A voltage signal application system comprising:
an application device; and
a piezoelectric energy hunting device for providing a voltage signal to the application device, the piezoelectric energy hunting device comprising:
  a plurality of curved piezoelectric elements arranged side by side with one another;
  a plurality of rigid foams, wherein each curved piezoelectric element is attached to one of the rigid foams; and
  a flexible foam structure covering the outer surface of the plurality of curved piezoelectric elements and the plurality of rigid foams;
  when the flexible foam structure is compressed, the plurality of curved piezoelectric elements are simultaneously deformed,
  thereby generating the voltage signal; when the flexible foam structure is not compressed, the flexible foam structure and the plurality of rigid foams provide an elastic force to restore the plurality of curved piezoelectric elements.

8. The voltage signal application system as claimed in claim 7, wherein the flexible foam structure comprises a top foam and a bottom foam, and the inner shapes of the top foam and the bottom foam correspond to the curvature of the curved piezoelectric element, thereby sandwiching the plurality of curved piezoelectric elements and the plurality of rigid foams between the top foam and the bottom foam.

9. The voltage signal application system as claimed in claim 8, wherein the top foam and the bottom foam comprise a plurality of layers of the plurality of curved piezoelectric elements and the plurality of rigid foams disposed therebetween.

10. The voltage signal application system as claimed in claim 7, wherein each curved piezoelectric element is a curved piezoelectric ceramic element.

11. The voltage signal application system as claimed in claim 7, wherein each curved piezoelectric element is a flexible piezoelectric element.

12. The voltage signal application system as claimed in claim 7, wherein the piezoelectric energy hunting device is disposed in a shoe or in a bicycle pedal.

13. The voltage signal application system as claimed in claim 12, wherein the voltage signal application system further comprises:
  a processing module for calculating a frequency generated by the voltage signal; and
  a wireless transmission module connected to the application device via a wireless transmission path; wherein when the frequency generated by the voltage signal exceeds a threshold, the processing module generates a notification signal to be transmitted to the application device via the wireless transmission path.

14. The voltage signal application system as claimed in claim 13, wherein the application device is an alarm for generating an alarm signal according to the received notification signal.

15. The voltage signal application system as claimed in claim 13, wherein the application device can be a radio frequency identification system (RFID) signal receiver; the wireless transmission module can obtain different radio frequency identification system signals according to the voltage signals generated by different piezoelectric energy hunting devices, and the application device receives different radio frequency identification system signals for combined identity identification.

16. The voltage signal application system as claimed in claim 13, wherein the application device further comprises an access control management module for performing access control management according to the notification signal sent by the wireless transmission module.

* * * * *